United States Patent
Ruan (10) Patent No.: US 8,842,986 B2
(45) Date of Patent: Sep. 23, 2014

(54) CIRCUIT AND METHOD FOR CONTROLLING MULTI-CHANNEL POWER

(75) Inventor: Dejin Ruan, Guangdong Province (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 449 days.

(21) Appl. No.: 13/257,973

(22) PCT Filed: May 21, 2010

(86) PCT No.: PCT/CN2010/073050
§ 371 (c)(1),
(2), (4) Date: Dec. 5, 2011

(87) PCT Pub. No.: WO2010/139241
PCT Pub. Date: Dec. 9, 2010

(65) Prior Publication Data
US 2012/0154012 A1   Jun. 21, 2012

(30) Foreign Application Priority Data
Jun. 5, 2009   (CN) .......................... 2009 1 0086489

(51) Int. Cl.
*H04B 10/08* (2006.01)
*H04B 10/291* (2013.01)
*H03G 3/30* (2006.01)
*H04J 14/02* (2006.01)
*H04B 10/06* (2006.01)

(52) U.S. Cl.
CPC .......... *H03G 3/3084* (2013.01); *H04B 10/291* (2013.01); *H04J 14/0221* (2013.01)
USPC ........................................................ 398/38

(58) Field of Classification Search
CPC .............................................. H04B 10/07955
USPC ............................ 398/38, 202, 208, 209, 210
See application file for complete search history.

(56) References Cited

U.S. PATENT DOCUMENTS

| | | | |
|---|---|---|---|
| 2002/0012152 A1* | 1/2002 | Agazzi et al. ................. | 359/189 |
| 2003/0035175 A1* | 2/2003 | Wu et al. ....................... | 359/139 |
| 2004/0208534 A1* | 10/2004 | Boertjes et al. ................. | 398/38 |
| 2007/0274725 A1 | 11/2007 | Takeyama et al. | |

FOREIGN PATENT DOCUMENTS

| | | |
|---|---|---|
| CN | 1663152 A | 8/2005 |
| CN | 101350661 A | 1/2009 |
| CN | 101577530 A | 11/2009 |

OTHER PUBLICATIONS

International Search Report for PCT/CN2010/073050 dated Aug. 16, 2010.

* cited by examiner

*Primary Examiner* — Daniel Dobson
(74) *Attorney, Agent, or Firm* — Stephen Yang; Ling Wu; Ling and Yang Intellectual Property (57) ABSTRACT

A circuit and a method for controlling multi-channel power are disclosed. The method includes: according to a channel selection signal in the previous clock cycle, select one channel signal from the received at least one channel signal in the previous clock cycle; according to an amplification factor control signal in the previous clock cycle, amplify the selected one channel signal to acquire a first signal; perform A/D conversion on the first signal to acquire a second signal; and according to the second signal, generate an amplification factor control signal in the next clock cycle, so that according to the amplification multiple control signal in the next clock cycle, amplify the selected one channel signal in the next clock cycle when the next clock cycle comes. The scheme can be used to detect the multi-channel optical power and its circuit implementation is simple.

20 Claims, 6 Drawing Sheets

CIRCUIT AND METHOD FOR CONTROLLING MULTI-CHANNEL POWER

TECHNICAL FIELD

The present invention relates to the field of communication device technology, and especially, to a circuit and method for controlling multi-channel power.

BACKGROUND OF THE RELATED ART

Figure 1:
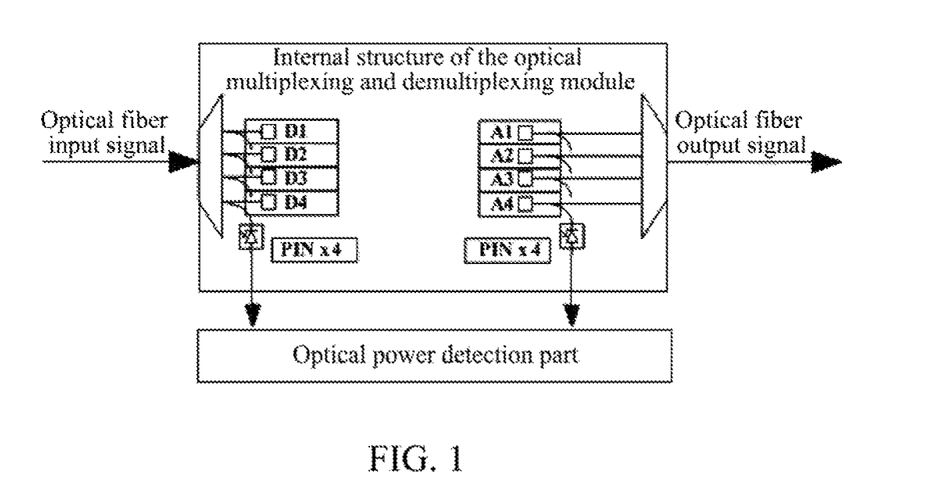
FIG. 1 is a schematic diagram of the optical path in the OAD in the prior art.

In the optical transmission system, Optical Add/Drop Unit Board (OAD) is often used to implement the add/drop multiplexing of optical signals, and the principle of optical path is shown in FIG. 1. The role of the OAD in the optical transmission system is responsible for the add/drop channel multiplex and demultiplex in one waveband, and A1, A2, A3 and A4 are the optical ports in the add channel of four signals with specific wavelengths of OAD, and the local services are uplinked to the system via these four optical ports to carry out transmission, and D1, D2, D3 and D4 are the optical ports in the drop channel of four signals with specific wavelengths of OAD, and the services transmitted in the system are downlinked to the local area via these four optical ports, and IN and OUT are the input and output optical ports of the OAD respectively. In practical network systems, it needs to detect the optical power of the signals at the optical ports A1, A2, A3, A4, D1, D2, D3 and D4 in the add and drop channels respectively. The function of service of the add/drop channel is implemented via one optical multiplexing and demultiplexing module fixed in the OAD, and the module is integrated with a positive intrinsic negative diode (PIN) inside. With the PIN diode, the optical signal through the eight optical ports in the add and drop channels are converted into a current signal which is generally very weak and can only be used after being post-amplified.

Due to factors such as signal intensity, photoelectric conversion efficiency of the PIN diode and signal insertion loss, the signal intensities at different optical ports in the add/drop channel might be significantly different with each other. If the gain of the amplification circuit remains constant, strong signals might be saturated or weak signals might be lost, thus the signals are distorted. Therefore, the gain of the amplification circuit should vary with the intensity of the input signal, and it needs to detect the intensity of the signal in each channel. For the multi-channel signal detection circuit, one set of individual detection circuit should be used in each channel in the prior art, and a large number of resistors, capacitors and active devices are used, thus the circuit is relatively complicated.

SUMMARY OF THE INVENTION

The technical problem to be solved by the present invention is to provide a simple circuit and method for controlling multi-channel power.

In order to solve the abovementioned technical problem, the technical scheme provided in the examples of the present invention is as follows:

On the one hand, the present invention provides a circuit for controlling multi-channel power, and said control circuit comprises:

a single channel selection module, configured that a first input end is inputting a channel selection signal in a previous clock cycle; a second input end is inputting at least one channel signal in the previous clock cycle; an output end is outputting one channel signal in the previous clock cycle selected from said at least one channel signal in the previous clock cycle according to the channel selection signal in the previous clock cycle;

a gain module, configured that a first input end is inputting an amplification factor control signal in the previous clock cycle; a second input end is inputting said one channel signal selected in the previous clock cycle; and an output end is outputting the first signal acquired by amplifying said one channel signal selected in the previous clock cycle according to said amplification factor control signal in the previous clock cycle;

an A/D conversion module, configured that an input end is inputting said first signal; an output end is outputting the second signal acquired by performing A/D conversion on the first signal; and a gain control module, configured that an input end is inputting said second signal; a first output end connects with the first input end of the single channel selection module and outputs the channel selection signals in the previous and next clock cycles, and the channel selection signal in the next clock cycle is identical to that in the previous clock cycle; a second output end connects to the first input end of said gain module, and outputs the amplification factor control signal in the previous clock cycle, as well as outputs the amplification factor control signal in the next clock cycle generated according to the second signal, so that the gain module amplifies one channel signal selected in the next clock cycle according to said amplification factor control signal in the next clock cycle.

Said gain module comprises:

a first amplifier, configured that a non-inverting input end connects to the output end of said single channel selection module; an inverting input end respectively connects to the first end of a divider resistor and the first end of at least one feedback resistor; an output end connects to the input end of said A/D conversion module; and a first one-out-of-multiple analog switch, configured that at least one first input end connects to the second end of said at least one feedback resistor respectively; a second input end connects to the second output end of said gain control module;

wherein, the second end of said divider resistor connects to the ground, and the number of the feedback resistors is the same as that of the first input ends of said first one-out-of-multiple analog switch.

Said gain module comprises:

the first amplifier, configured that the non-inverting input end connects to the output end of said single channel selection module; the inverting input end respectively connects to the first end of the divider resistor and the first end of at least one feedback resistor;

the first one-out-of-multiple analog switch, configured that at least one first input end connects to the second end of said at least one feedback resistor respectively; the second input end connects to the second output end of said gain control module; and a second amplifier, configured that a non-inverting input end connects to the output end of said first amplifier; an inverting input end connects to an output end of the second amplifier; the output end connects to the input end of said A/D conversion module;

wherein, the second end of said divider resistor connects to the ground, and the number of the feedback resistors is the same as the number of the first input ends of said first one-out-of-multiple analog switch.

Said gain module comprises the first amplifier, configured that the non-inverting input end connects to the output end of said single channel selection module; the inverting input end respectively connects to the first end of the divider resistor and the first end of at least one feedback resistor;

the first one-out-of-multiple analog switch, configured that at least one first input end connects to the second end of said at least one feedback resistor respectively; the second input end connects to the second output end of said gain control module; the output end connects to the output end of said first amplifier; and a second one-out-of-multiple analog switch, configured that at least one first input end connects with the second end of said at least one feedback resistor respectively; a second input end connects to the second output end of said gain control module; an output end connects to the input end of said A/D conversion module;

wherein, the second end of said divider resistor connects to the ground, and the number of the feedback resistors is the same as the number of the first input ends of said first one-out-of-multiple analog switch, and the number of the first input ends of said second one-out-of-multiple analog switch is the same as that of the first input ends of said first one-out-of-multiple analog switch.

Said gain module comprises the first amplifier, configured that the non-inverting input end connects to the output end of said single channel selection module; the inverting input end respectively connects to the first end of the divider resistor and the first end of at least one feedback resistor;

the first one-out-of-multiple analog switch, configured that at least one first input end connects to the second end of said at least one feedback resistor respectively; the second input end connects to the second output end of said gain control module; the output end connects to the output end of said first amplifier;

the second one-out-of-multiple analog switch, configured that at least one first input end connects to the second end of said at least one feedback resistor respectively; the second input end connects to the second output end of said gain control module; and the second amplifier, configured that the non-inverting input end connects to the output end of said second one-out-of-multiple analog switch; the inverting input end connects to the output end of said second amplifier, and the output end of the second amplifier connects to the input end of said A/D conversion module;

wherein, the second end of said divider resistor connects to the ground, and the number of the feedback resistors is the same as that of the first input ends of said first one-out-of-multiple analog switch, and the number of the first input ends of the second one-out-of-multiple analog switch is the same as that of the first input ends of said first one-out-of-multiple analog switch.

The amplification factor of said amplification factor control signal in the next clock cycle is $k=1+Rf/R0$, where $Rf$ is the resistance of the resistor selected from said at least one feedback resistor according to the amplification factor control signal in the next clock cycle, and $R0$ is the resistance of the divider resistor.

The amplification factor $k$ is set as a power of 2.

Said single channel selection module is also configured to: connect its second input end to an output end of a optical multiplexing and demultiplexing module on the optical add/drop unit board (OAD).

When the number of said at least one feedback resistor is greater than 1, and the resistance values of said at least one feedback resistor are different.

Said channel selection signal is the signal selected by in turn cycling each channel signal of received said at least one channel signal.

On the other hand, the present invention provides a method for controlling multi-channel power, and the method comprises:

selecting one channel signal in a previous clock cycle from received at least one channel signal in the previous clock cycle according to a channel selection signal in the previous clock cycle;

amplifying said one channel signal selected in the previous clock cycle according to an amplification factor control signal in the previous clock cycle to acquire a first signal;

Performing A/D conversion on the first signal to acquire a second signal; and generating an amplification factor control signal in a next clock cycle according to said second signal, so as to amplify said one channel signal selected in the next clock cycle according to the amplification factor control signal in the next clock cycle when the next clock cycle comes, wherein, said one channel signal selected in the previous clock cycle is the same as the one channel signal selected in the next clock cycle.

The examples of the present invention have the following beneficial effects:

In the abovementioned scheme, during the previous clock cycle, the single channel selection module selects one channel signal in the previous clock cycle from at least one channel signal received in the previous clock cycle according to the channel selection signal in the previous clock cycle; the gain module amplifies the selected one channel signal in the previous clock cycle according to the amplification factor control signal in the previous clock cycle so as to acquire the first signal; the A/D conversion module performs A/D conversion on the first signal to acquire the second signal; the gain control module generates the amplification factor control signal in the next clock cycle according to said second signal.

The channel selection signal in the next clock cycle is the same as that in the previous clock cycle, therefore the selected one channel signal in the previous clock cycle is the same as the selected one in the next clock cycle. In the next clock cycle, the single channel selection module selects one channel signal which is the same as the selected channel signal in the previous clock cycle; the gain module amplifies the selected one channel signal in the next clock cycle according to the amplification factor control signal in the next clock cycle. Therefore, for the selected channel signal, it can be amplified with a suitable amplification factor in the next clock cycle. For the multi-channel signal input by the single channel selection module, there is no need to set one individual detection circuit for each channel signal, and the multi-channel power control circuit can be shared, thus the circuit implementation is relatively simple.

PREFERRED EMBODIMENTS OF THE PRESENT INVENTION

In order to make the technical problem to be solved, the technical scheme and advantages in the present invention more evident, the present invention will be described in detail in combination with the accompanying figures and specific examples.

According to the problem that the circuit is complicated in the prior art since one set of individual detection circuit is used in each channel, the example of the present invention provides a circuit and method for controlling multi-channel power.

Figure 2:
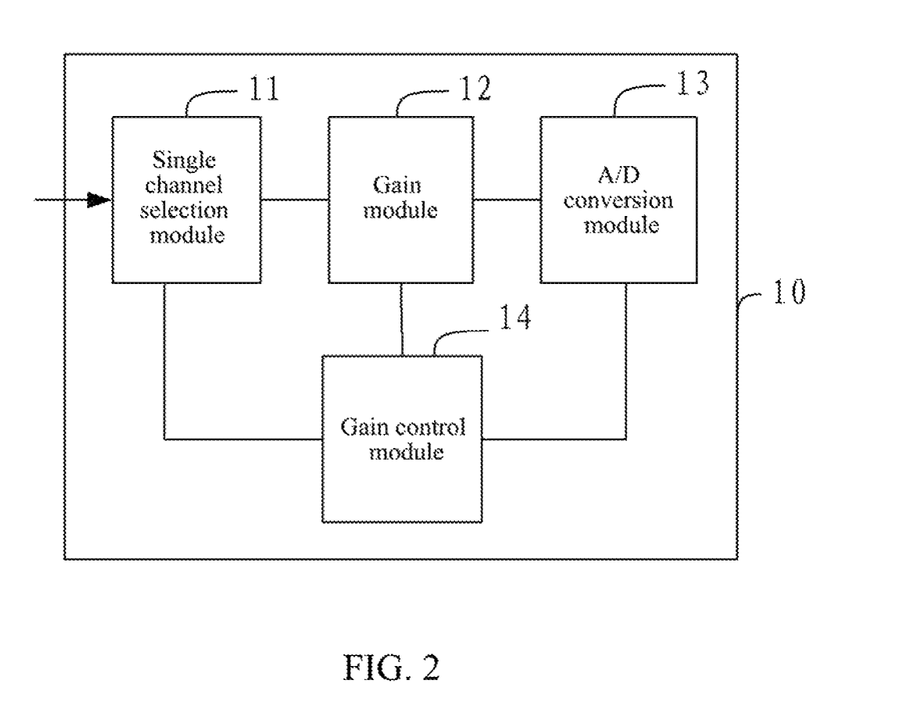
FIG. 2 is a connection schematic diagram of one example of the circuit for controlling the multi-channel power in accordance with the present invention.

FIG. 2 is one example of the multi-channel power control circuit 10 in the present invention, and the circuit comprises:

a single channel selection module 11, a gain module 12, an A/D conversion module 13, and a gain control module 14.

The single channel selection module 11, its first input end inputs the channel selection signal in the previous clock cycle; its second input end inputs at least one channel signal in the previous clock cycle; its output end outputs one channel signal in the previous clock cycle selected from said at least one channel signal in the previous clock cycle according to said channel selection signal in the previous clock cycle;

the gain module 12, its first input end inputs the amplification factor control signal in the previous clock cycle; the second input end inputs the selected one channel signal in the previous clock cycle; the output end outputs the first signal acquired by amplifying the selected one channel signal in the previous clock cycle according to the amplification factor control signal in the previous clock cycle;

the A/D conversion module 13, its input end inputs the first signal; the output end outputs the second signal acquired by performing A/D conversion on the first signal;

the gain control module 14, its input end inputs said second signal; the first output end connects to the first input end of said single channel selection module 11 and is used to output the channel selection signals in the previous and next clock cycles, where the channel selection signal in the next clock cycle is the same as the channel selection signal in the previous clock cycle; the second output end connects to the first input end of the gain module 12 and is used to output the amplification factor control signal in the previous clock cycle and said amplification factor control signal in the next clock cycle generated according to said second signal, so that the gain module 12 amplifies the selected one channel signal in the next clock cycle according to said amplification factor control signal in the next clock cycle.

When the multi-channel power control circuit works initially, that is, in the previous clock cycle, the gain module 12 uses the default amplification factor, that is, the gain control module 14 outputs the default or preset amplification factor control signal, and determines the amplification factor control signal output in the next clock cycle according to the second signal input in the previous clock cycle, so as to control the amplification factor of the gain module 12 in the next clock cycle.

In the abovementioned scheme, during the previous clock cycle, the single channel selection module 11 selects one channel signal in the previous clock cycle from at least one channel signal received in the previous clock cycle according to the channel selection signal in the previous clock cycle; the gain module 12 amplifies the selected one channel signal in the previous clock cycle according to the amplification factor control signal in the previous clock cycle to acquire the first signal; the A/D conversion module 13 perform A/D conversion on the first signal to acquire the second signal; the gain control module 14 generates the amplification factor control signal in the next clock cycle according to said second signal.

The channel selection signal in the next clock cycle is the same as that in the previous clock cycle, therefore the selected one channel signal in the previous clock cycle is the same as the selected one channel signal in the next clock cycle. In the next clock cycle, the single channel selection module selects one channel signal which is the same as the selected channel signal in the previous clock cycle; the gain module 12 amplifies the selected one channel signal in the next clock cycle according to the amplification factor control signal in the next clock cycle. Therefore, for the selected channel signal, a suitable amplification factor can be used to amplify the signal in the next clock cycle. For the multi-channel signal input by the single channel selection module, there is no need to set one set of individual detection circuit for each channel signal, and the multi-channel power control circuit can be shared, thus the circuit implementation is relatively simple.

Figure 3:
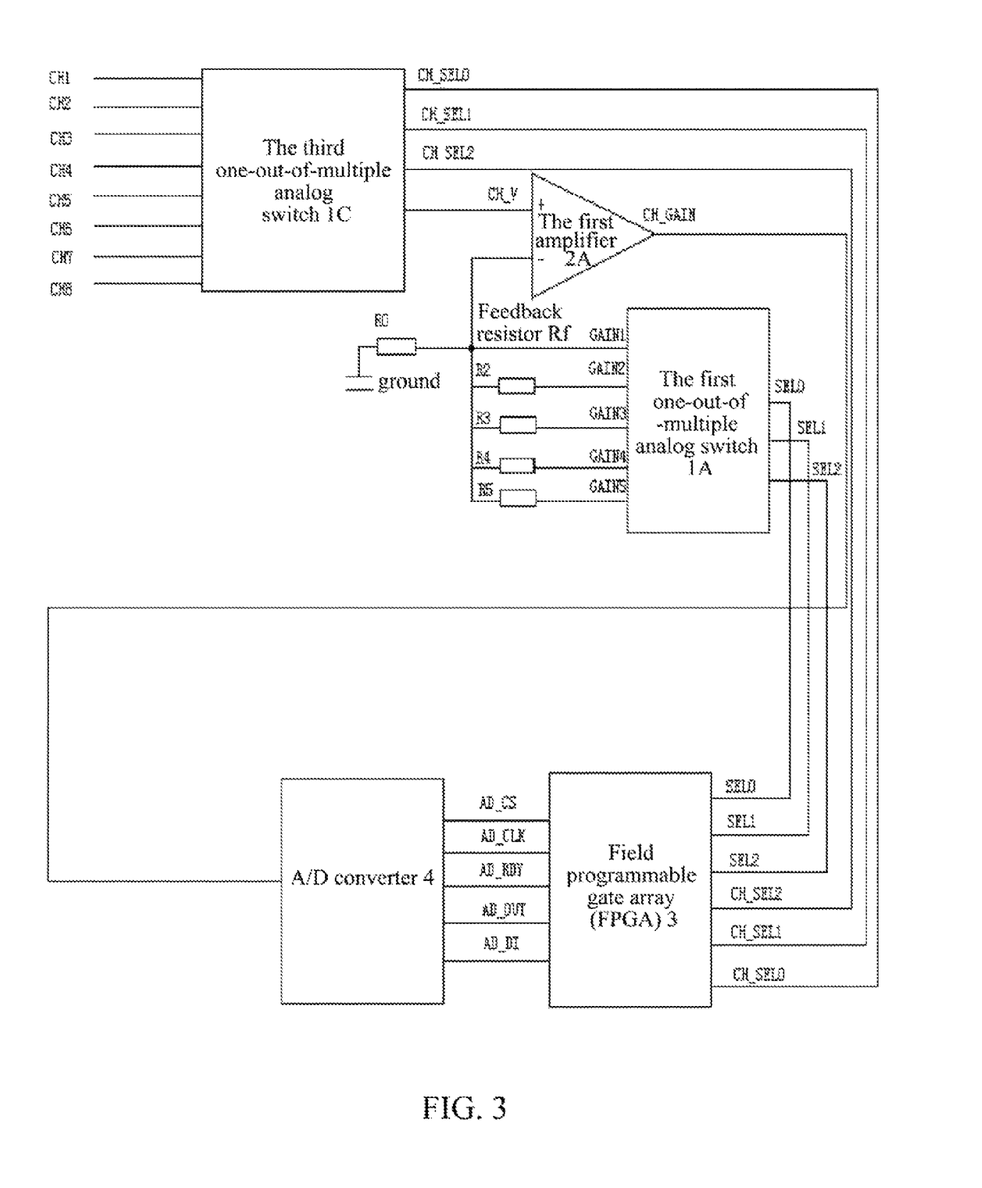
FIG. 3 is a connection schematic diagram of another example of the circuit for controlling the multi-channel power in accordance with the present invention.

FIG. 3 is another example of the multi-channel power control circuit 10 in accordance with the present invention, and in the circuit, the single channel selection module is the third one-out-of-multiple analog switch 1C, the A/D conversion module is the A/D converter 4, and the gain control module is the field programmable gate array (FPGA) 3 or a dedicated gain control chip.

Said gain module 12 comprises:

the first amplifier 2A, the non-inverting input end of the first amplifier 2A connects to the output end of said single channel selection module; the inverting input end of the first amplifier 2A respectively connects to the first end of the divider resistor R0 and the first end of at least one feedback resistor Rf; the output end of the first amplifier connects to the input end of said A/D conversion module;

the first one-out-of-multiple analog switch 1A, at least one first input end of the first one-out-of-multiple analog switch 1A connects to the second end of said at least one feedback resistor Rf respectively; the second input end of the first one-out-of-multiple analog switch 1A connects to the second output end of said gain control module; and the second end of said divider resistor R0 connects to the ground, and the number of the feedback resistors Rf is the same as that of the first input ends of said first one-out-of-multiple analog switch 1A, and the resistance values of the feedback resistors Rf are different.

The working principle of the present invention will be illustrated in combination with FIG. 3.

In the previous clock cycle, at least one channel signal, which are respectively CH1, CH2, CH3, CH4, CH5, CH6, CH7 and CH8 in the present example, is input to the third one-out-of-multiple analog switch, and at least one channel selection signal, which are CH_SEL0, CH_SEL1 and CH_SEL2 in the present example, from the FPGA 3 is input, and the output end of the single channel selection module 11 outputs one channel signal CH_V selected from the channel signals according to said channel selection signal.

The non-inverting input end of the first amplifier 2A connects to the output end of said single channel selection module, that is, input the selected one channel signal CH_V, and the inverting input end of the first amplifier 2A respectively connects to the first end of the divider resistor R0 and the first end of at least one feedback resistor Rf, and in this example, the feedback resistors Rf comprise R1 (whose resistance is 0 ohm, not shown), R2, R3, R4 and R5, and the output end of the first amplifier 2A connects to the input end of the A/D conversion module, that is, output the amplified signal CH_GAIN. It is understood by those skilled in the art that there can be more feedback resistors Rf to be configured. The maximum number of feedback resistors Rf which can be configured has a relationship of power of 2 with the number of the amplification factor control signals, that is, if there are eight feedback resistors Rf, the number of amplification factor control signals can be three.

In the first one-out-of-multiple analog switch 1A, at least one first input end (which are GAIN1, GAIN2, GAIN3, GAIN4 and GAIN5 in this example) respectively connects to the second end of at least one feedback resistor Rf (in this example, the feedback resistors are R1, R2, R3, R4 and R5), and the signal input to the second input end of the first one-out-of-multiple analog switch 1A is the amplification factor control signal of the gain control module, that is, input the second chip selection signals SEL0, SEL1 and SEL2 to the second input end of the first one-out-of-multiple analog switch 1A.

The second end of said divider resistor R0 connects to the ground, and the number of the feedback resistors Rf is the same as that of the first input ends of said first one-out-of-multiple analog switch 1A, and the resistance values of the feedback resistors Rf are different.

The input end of the A/D converter 4 inputs the amplified signal, that is, the first signal CH_GAIN, and the output end of the A/D converter 4 outputs the amplified and A/D converted signal, that is, the second signal AD_OUT.

The input end of the FPGA 3 inputs the amplified and A/D converted signal, that is, the second signal AD_OUT, and outputs the channel selection signals, which are respectively CH_SEL0, CH_SEL1, and CH_SEL2 in the present example, and outputs the amplification factor control signals in the previous and next clock cycles, and the amplification factor control signals are SEL0, SEL1 and SEL2 in the present example, and the amplification factor control signal in the next clock cycle is generated according to the value of the second signal.

In the present example, during the previous clock cycle, the gain control module inputs the second signal, and generates the amplification factor control signal in the next clock cycle according to the value of the second signal, and outputs the amplification factor control signal in the next clock cycle to the first one-out-of-multiple analog switch 1A, so that the amplification factor control signal in the next clock cycle can select feedback resistors Rf with different resistance values, therefore, the amplification factor of the amplification signal output from the amplifier is different. When the amplified and A/D converted signal is less than the first threshold, select an amplification factor greater than the second threshold; when the amplified and A/D converted signal is greater than or equal to the first threshold, select an amplification factor less than or equal to the second threshold. That is, for large signals, small amplification factor is applied, and for small signals, large amplification factor is applied. In this example, the formula to calculate the amplification factor in the next clock cycle is: the circuit amplification factor is: $k=1+(Rf+Ron)/R0$. Wherein, Ron is the on-resistance of the one-out-of-multiple analog switch, and Rf is the resistance of the resistor selected from said at least one feedback resistor Rf according to the amplification factor control signal in the next clock cycle, and R0 is resistance of the divider resistor.

Figure 4:
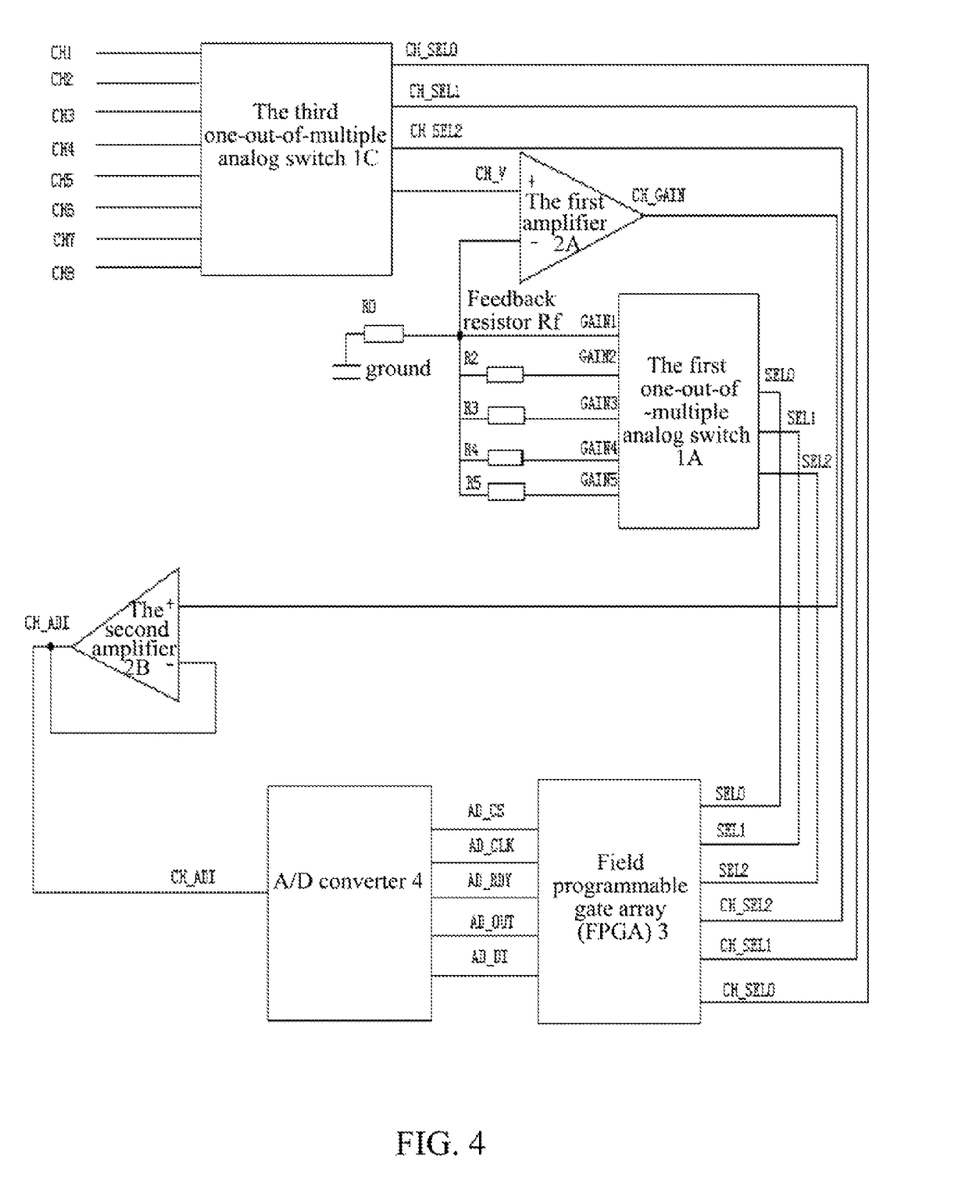
FIG. 4 is a connection schematic diagram of still another example of the circuit for controlling the multi-channel power in accordance with the present invention.

FIG. 4 is another example of the multi-channel power control circuit 10 in accordance with the present invention, wherein the single channel selection module is the third one-out-of-multiple analog switch 1C, the A/D conversion module is the A/D converter 4, and the gain control module is the field programmable gate array (FPGA) 3 or a dedicated gain control chip. Said gain module 12 comprises:

the first amplifier 2A, the non-inverting input end of the first amplifier 2A connects to the output end of said single channel selection module and inputs the selected one channel signal; the inverting input end of the first amplifier 2A respectively connects to the first end of the divider resistor R0 and the first end of at least one feedback resistor Rf;

the first one-out-of-multiple analog switch 1A, at least one first input end of the first one-out-of-multiple analog switch 1A connects to the second end of said at least one feedback resistor Rf respectively, and the second input end of the first one-out-of-multiple analog switch 1A connects to the second output end of said gain control module;

the second amplifier 2B, the non-inverting input end of the second amplifier 2B connects to the output end of the first amplifier 2A; the inverting input end of the second amplifier 2B connects to the output end of the second amplifier 2B; the output end of the second amplifier 2B connects to the input end of said A/D conversion module;

the second end of said divider resistor R0 connects to the ground, and the number of the feedback resistors Rf is the same as that of the first input ends of said first one-out-of-multiple analog switch 1A, and the resistance values of the feedback resistors Rf are different.

Compared with the example in FIG. 3, the difference of the example in FIG. 4 is: the amplified signal CH_GAIN output by the first amplifier 2A in FIG. 4 is not directly input to the input end of the A/D conversion module but via the second amplifier 2B, that is, the signal CH_GAIN is input to the second amplifier 2B, and then the second amplifier 2B outputs the signal CH_ADI to the input end of the A/D converter 4. The amplification factor of the second amplifier 2B is 1, and it has a function of stabilizing the voltage.

Figure 5:
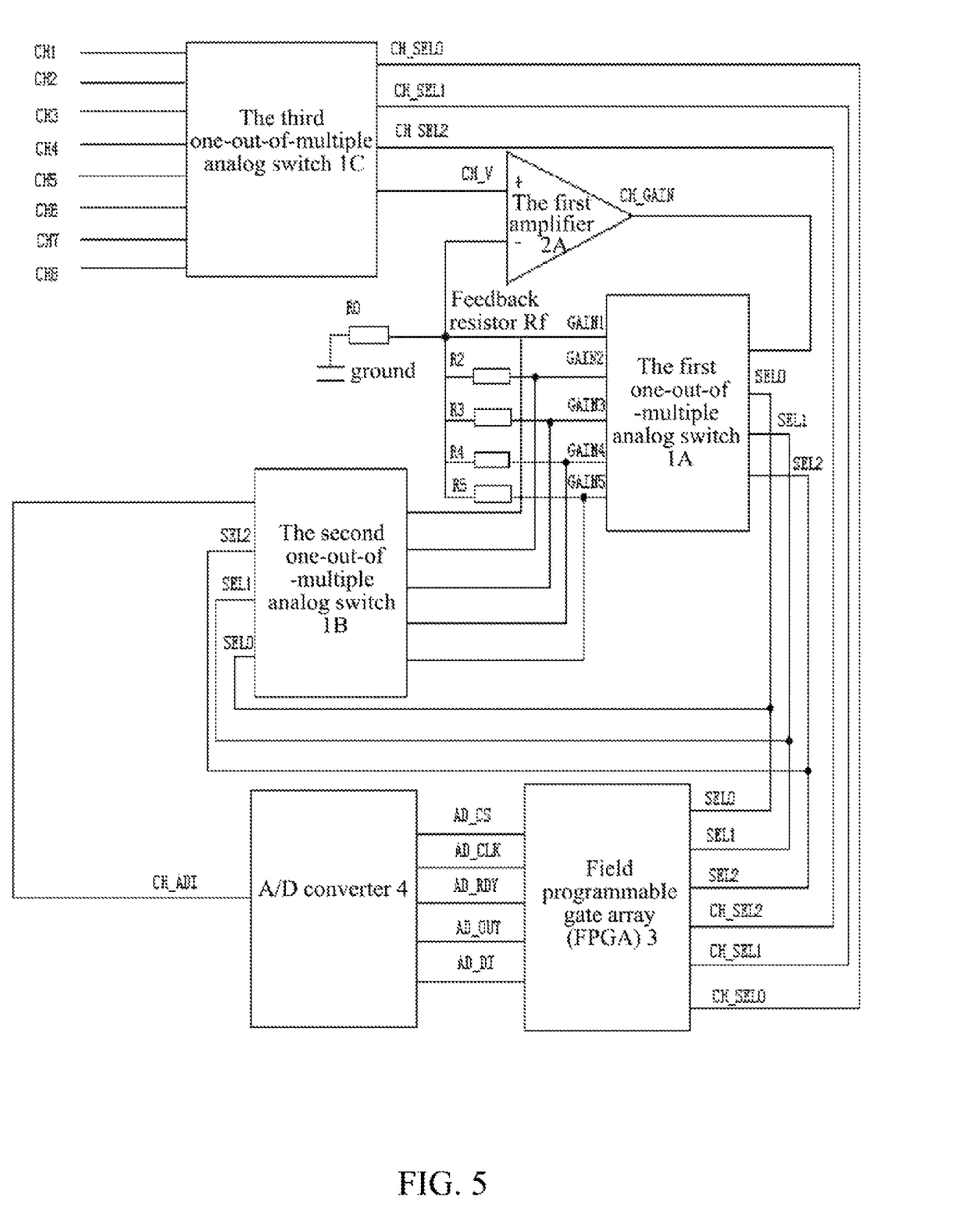
FIG. 5 is a connection schematic diagram of still another example of the circuit for controlling the multi-channel power in accordance with the present invention.

FIG. 5 is still another example of the multi-channel power control circuit 10 in accordance with the present invention, wherein, the single channel selection module is the third one-out-of-multiple analog switch 1C, the A/D conversion module is the A/D converter 4, and the gain control module is the FPGA 3 or a dedicated gain control chip. Said gain module 12 comprises:

the first amplifier 2A, its non-inverting input end connects to the output end of said single channel selection module; the inverting input end respectively connects to the first end of the divider resistor R0 and the first end of at least one feedback resistor Rf;

the first one-out-of-multiple analog switch 1A, at least one first input end of the first one-out-of-multiple analog switch 1A connects to the second end of said at least one feedback resistor Rf respectively; the second input end of the first one-out-of-multiple analog switch 1A connects to the second output end of said gain control module; and the output end of the first one-out-of-multiple analog switch 1A connects to the output end of the first amplifier 2A;

the second one-out-of-multiple analog switch 1B, at least one first input end of the second one-out-of-multiple analog switch 1B connects to the second end of said at least one feedback resistor Rf respectively; the second input end of the second one-out-of-multiple analog switch 1B connects to the second output end of said gain control module; and the output end of the second one-out-of-multiple analog switch 1B connects to the input end of said A/D conversion module;

the second end of said divider resistor R0 connects to the ground, and the number of the feedback resistors Rf is the same as that of the first input ends of said first one-out-of-multiple analog switch 1A, and the number of the first input ends of said second one-out-of-multiple analog switch 1B is the same as that of the first input ends of said first one-out-of-multiple analog switch 1A and the resistance values of the feedback resistors Rf are different.

The working principle of examples of the present invention is described below in combination with FIG. 5.

The role of the third one-out-of-multiple analog switch 1C is to select one channel signal from the eight input channels (can also be any number of input channels) and send it to the subsequent amplification circuit to be amplified, and the multi-channel signal input by the single channel selection module is from the output end of the optical multiplexing and demultiplexing module in the OAD, that is, select one of the eight channel signals CH1, CH2, CH3, CH4, CH5, CH6, CH7 and CH8 output by the optical multiplexing and demultiplexing module on the OAD and send it to the subsequent circuit to be amplified. The channel selection signals CH_SEL0, CH_SEL1 and CH_SEL2 of the third one-out-of-multiple analog switch 1C are provided by the FPGA 3. In the present example, the third one-out-of-multiple analog switch 1C can be the MAX4051 from the Maxim Integrated Products, wherein MAX4051 is a one-out-of-eight analog switch, and the third one-out-of-multiple analog switch 1C can also be other chip.

The role of the gain module is to perform gain amplification on the signal sent from the third one-out-of-multiple analog switch 1C at the previous stage, and the gain module consists of the first amplifier 2A, the first one-out-of-multiple analog switch 1A, the second one-out-of-multiple analog switch 1B, and resistors R1 (resistance is 0 ohm, not shown), R2, R3, R4 and R5 with different resistance values, and one divider resistor R0. The non-inverting input end of the first amplifier 2A connects to the output signal CH_V of the third one-out-of-multiple analog switch 1A, and the inverting input end of the first amplifier 2A connects to the five input ends of the first one-out-of-multiple analog switch 1A and the second one-out-of-multiple analog switch 1B respectively by bridging feedback resistors Rf with different resistance values. The amplification factor control signals SEL0, SEL1, SEL2 of the first one-out-of-multiple analog switch 1A and the second one-out-of-multiple analog switch 1B are provided by the FPGA 3. The combinations of three signals SEL0, SEL1 and SEL2 can provide eight different gains for the amplifier 2A. In the present example, for the convenient processing of the board, five-stage amplification is designed. In this part of circuit, the output signal CH_GAIN of the first amplifier 2A is not directly sent to the input end of the A/D converter 4, while the signal is acquired from the input end of the one-out-of-multiple analog switch 1B via the one-out-of-multiple analog switch 1A, and it is because the first one-out-of-multiple analog switch 1A has a channel on-resistance of about 80-130 ohm, and this on-resistance will affect the influence of the gain circuit on the amplification precision, and with the abovementioned procedure, the amplification precision is not affected by the on-resistance. That is, in order to avoid the influence of the on-resistance of the first one-out-of-multiple analog switch 1A on the amplification precision, the signal sent to the input end of the A/D converter 4 is not directly extracted from the CH_GAIN at the output end of the first amplifier 2A, but it is sent via the second one-out-of-multiple analog switch 1B after being extracted from the port of the first one-out-of-multiple analog switch 1A. The input end of the first amplifier 2A can be considered as infinite, therefore, the on-resistances Ron of the first one-out-of-multiple analog switch 1A and the second one-out-of-multiple analog switch 1B will not affect the amplification precision. The amplification factor of the amplification factor control signal in the next clock cycle is: $k=1+Rf/R0$. Wherein, Rf is the resistance of the resistor selected from said at least one feedback resistor Rf according to the amplification factor control signal in the next clock cycle, and R0 is the resistance of the divider resistor, and the principle of selecting the amplification factor k is: use large amplification factors for small signals and use small amplification factors for large signals. The amplification factor k is determined by the value of the input signal CH_V of the amplifier 2A, and if the input signal CH_V is relatively small, select a relatively large k value, otherwise, select a relatively small k value.

Wherein, the first amplifier 2A can be the operational amplifier OPA4277A, and the first one-out-of-multiple analog switch 1A and the second one-out-of-multiple analog switch 1B can be the one-out-of-eight analog switch MAX4051 from the Maxim Integrated Products, or any other alternative chip. The amplification factor k can be set as a power of 2, for example, the amplification factors k are respectively 1, 4, 16, 64 and 256. When processing the data, only shift operation is needed, and the board might use the 2 bytes (UNIT, integer type) to store the value of AD_OUT, and in the present invention, the values are: R1=0 ohm, R2=6 kilo-ohm, R3=30 kilo-ohm, R4=126 kilo-ohm, R5=510 kilo-ohm; and R0 is the ground resistor, and its resistance is 2 kilo-ohm. In hardware, the channel selection signals SEL0, SEL1 and SEL2 of the first one-out-of-multiple analog switch 1A and the second one-out-of-multiple analog switch 1B are provided by the FPGA 3. The FPGA 3 takes the amplified and A/D converted signal AD_OUT output from the AD converter 4 as the judgment basis, and when the AD_OUT is lower than a certain order of magnitude and there is a higher gain level available, select a larger amplification factor k, and the selection of the amplification factor is selecting different feedback resistors Rf to change the amplification factor k with the signals SEL0, SEL1 and SEL2 connecting with the first one-out-of-multiple analog switch 1A. After amplified, the signal CH_V is sent from the output end of the one-out-of-multiple analog switch 1C to the A/D converter 4 to perform A/D conversion.

The A/D converter 4 performs A/D conversion on the amplified signal, and the amplified signal is sent to the A/D conversion circuit via the signal output end CH_ADI of the amplifier 2B, and after the A/D conversion, the signal AD_OUT is output to the FPGA 3 to be processed, the chip selection signal AD_CS, the clock signal AD_CLK and other control signals such as AD_RDY and AD_DI are provided by the FPGA 3. In this example, the A/D converter 4 can be the 10-bit serial AD conversion chip ADC10738 or any other chip, and its input end connects to the output end signal CH_ADI of the second one-out-of-multiple analog switch, and the A/D converted output signal AD_OUT is sent to the FPGA 3 to be processed.

The role of the field programmable gate array (FPGA) 3 is to provide channel selection signals for three one-out-of-multiple analog switches (1A, 1B and 1C); that is, provide channel selection signals CH_SEL0, CH_SEL1 and CH_SEL2 for the third one-out-of-multiple analog switch 1C, and provide the amplification factor control signals SEL0, SEL1 and SEL2 in the previous clock cycle and the next clock cycle for the first one-out-of-multiple analog switch 1A and the second one-out-of-multiple analog switch 1B; provide the control signal AD_RDY, the chip selection signal AD_CS and the clock signal AD_CLK and so on for the A/D converter 4; judge the input value of the signal AD_OUT in the previous clock cycle output after the A/D conversion to select the optimal gain level in the next clock cycle, that is, select the optimal gain amplification factor K in the next clock cycle. In this example, the FPGA 3 can be the LFE2-12E-5FN484C chip from the Lattice semiconductor company, and it provides the control and communication interface for the whole circuits in the present invention, but other chip might also be applied.

Figure 6:
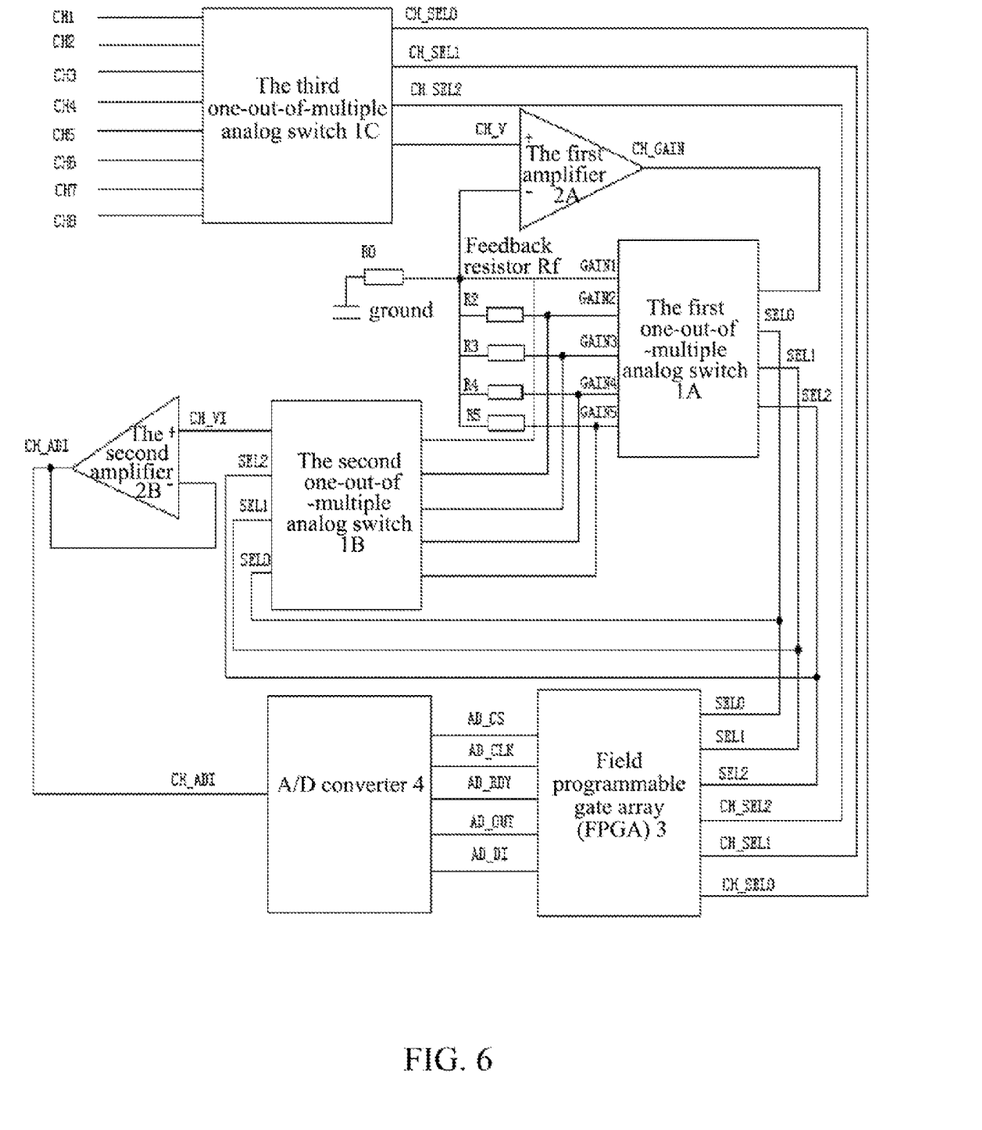
FIG. 6 is a connection schematic diagram of still another example of the circuit for controlling the multi-channel power in accordance with the present invention.

FIG. 6 is still another example of the multi-channel power control circuit 10 in accordance with the present invention, wherein, the single channel selection module is the third one-out-of-multiple analog switch 1C, the A/D conversion module is the A/D converter 4, and the gain control module is the FPGA 3 or a dedicated gain control chip. Said gain module 12 comprises:

the first amplifier 2A, the non-inverting input end of the first amplifier 2A connects to the output end of said single channel selection module; the inverting input end of the first amplifier 2A respectively connects to the first end of the divider resistor R0 and the first end of at least one feedback resistor Rf;

the first one-out-of-multiple analog switch 1A, at least one first input end of the first one-out-of-multiple analog switch 1A connects to the second end of said at least one feedback resistor Rf respectively; the first one-out-of-multiple analog switch 1A connects with the second output end of said gain control module; and the output end of the first one-out-of-multiple analog switch 1A connects to the output end of the first amplifier 2A;

the second one-out-of-multiple analog switch 1B, at least one first input end of the second one-out-of-multiple analog switch 1B connects to the second end of said at least one feedback resistor Rf respectively; the second input end of the second one-out-of-multiple analog switch 1B connects to the second output end of said gain control module;

the second amplifier 2B, the non-inverting input end of the second amplifier 2B connects to the output end of said second one-out-of-multiple analog switch 1B; the inverting input end of the second amplifier 2B connects to the output end of the second amplifier 2B; the output end of the second amplifier 2B connects to the input end of said A/D conversion module;

the second end of said divider resistor R0 connects to the ground, and the number of the feedback resistors Rf is the same as that of the first input ends of said first one-out-of-multiple analog switch 1A, and the number of the first input ends of the second one-out-of-multiple analog switch 1B is the same as that of the first input ends of the first one-out-of-multiple analog switch 1A, moreover, the resistance values of the feedback resistors Rf are different.

Compared to the example in FIG. 5, the difference of the example in FIG. 6 is: the signal CH_VI output from the second one-out-of-multiple analog switch in FIG. 6 is not directly input to the input end of the A/D conversion module, but the signal is through the second amplifier 2B, that is, the signal CH_VI is input to the second amplifier 2B, and then the second amplifier 2B outputs the signal CH_ADI to the input end of the A/D converter 4. The second amplifier 2B can be the operational amplifier OPA4277B, and the amplification factor of the second amplifier 2B is 1, and has a function of stabilizing the voltage.

In the circuit of the present invention, the gain of the amplification circuit changes with the intensity of the input signal, and the number of resistors in use is relatively small, thus it is not easy to create oscillation reliability and it has a good anti-interference capability. The circuit of the present invention is simple, has low cost, and it has automatic gain amplification function, which is very suitable for the multi-channel optical power detection circuit in the optical transmission system. The present invention also has advantages such as improving the conversion precision of the small signal and increasing the dynamic range of the optical power detection circuit. The present invention can be used in the multi-channel optical power detection in the optical transmission system and other circuits. The gain control module in the present invention can be a field programmable gate array (FPGA) chip or a dedicated gain control chip.

Figure 7:
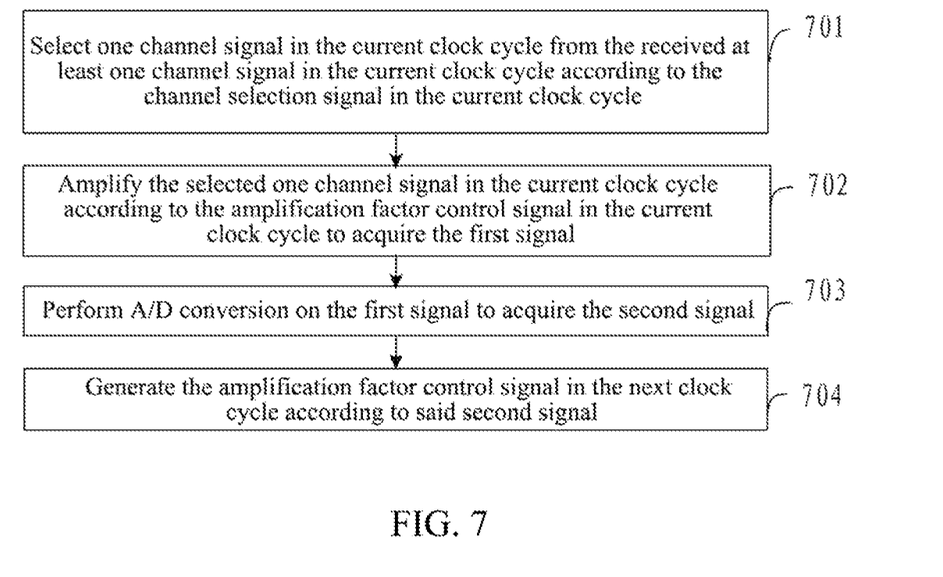
FIG. 7 is a flow chart of one example of the method for controlling the multi-channel power in accordance with the present invention.

As shown in FIG. 7, it is a method for controlling multi-channel power in accordance with the present invention, and the method comprises:

Step 701: select one channel signal in the previous clock cycle from the received at least one channel signal in the previous clock cycle according to the channel selection signal in the previous clock cycle; the previous clock cycle is adjacent to the next clock cycle, that is, the pervious clock cycle is the current clock cycle;

Step 702: amplify the selected one channel signal in the previous clock cycle according to the amplification factor control signal in the previous clock cycle to acquire the first signal;

Step 703: perform A/D conversion on the first signal to acquire the second signal;

Step 704: generate the amplification factor control signal in the next clock cycle according to said second signal, so as to amplify the selected one channel signal in the next clock cycle according to the amplification factor control signal in the next clock cycle when the next clock cycle comes, wherein, the selected one channel signal in the previous clock cycle is the same as the selected one channel signal in the next clock cycle.

In the abovementioned scheme, during the previous clock cycle, use the amplification factor control signal in the previous clock cycle to amplify the selected one channel signal in the previous clock cycle, and the amplification factor control signal in the previous clock cycle can be the default signal or a preset signal, and determine the amplification factor control signal in the next clock cycle according to the second signal so as to control the amplification factor of the selected one channel signal in the next clock cycle.

Since the selected one channel signal in the previous clock cycle is the same as the selected one channel signal in the next clock cycle, for the selected one channel signal, a suitable amplification factor can be used to amplify the signal in the next clock cycle. For the multi-channel signal input by the single channel selection module, there is no need to set one set of individual detection circuit for each channel signal, and the multi-channel power control circuit can be shared, thus the circuit implementation is relatively simple.

It should be understood by those skilled in the art that all or part of the steps of the method implementing the abovementioned example are completed by commanding the related hardware with programs, and said programs are stored in the computer-readable storage media, and when the programs, including the steps of the abovementioned method example, are running, said storage media can be, for example, a magnetic disk, optical disk, read-only memory (ROM) or random access memory (RAM) and so on.

The above description is the preferred embodiments of the present invention, and it should be pointed out that for those skilled in the art, several modifications and improvements can be made without departing from the principle of the present invention, and all these modifications or improvements should be considered as falling into the protection scope of the present invention.

INDUSTRIAL APPLICABILITY

In the present invention, for the multi-channel signal input by the single channel selection module, there is no need to set one set of individual detection circuit for each channel signal, and the multi-channel power control circuit is shared, thus the circuit implementation is relatively simple.

What is claimed is:

1. A circuit for controlling multi-channel power, said circuit comprising:
    a single channel selection module, configured that a first input end inputs a channel selection signal in a previous clock cycle; a second input end inputs at least one channel signal in the previous clock cycle; an output end outputs one channel signal in the previous clock cycle selected from said at least one channel signal in the previous clock cycle according to the channel selection signal in the previous clock cycle;
    a gain module, configured that a first input end inputs an amplification factor control signal in the previous clock cycle; a second input end inputs said one channel signal selected in the previous clock cycle; and an output end outputs a first signal acquired by amplifying said one channel signal selected in the previous clock cycle according to said amplification factor control signal in the previous clock cycle;
    an A/D conversion module, configured that an input end inputs said first signal; an output end outputs a second signal acquired by performing A/D conversion on the first signal; and
    a gain control module, configured that an input end inputs said second signal; a first output end connects with the first input end of the single channel selection module and outputs the channel selection signals in the previous clock cycle and a next clock cycle, and the channel selection signal in the next clock cycle is the same as that in the previous clock cycle; a second output end connects with the first input end of said gain module, and outputs the amplification factor control signal in the previous clock cycle, as well as outputs the amplification factor control signal in the next clock cycle generated according to the second signal, wherein when said second signal is less than a first threshold, the amplification factor in the next clock cycle is greater than a second threshold, and when said second signal is greater than or equal to the first threshold, the amplification factor in the next clock cycle is less than or equal to the second threshold, so that the gain module amplifies one channel signal selected in the next clock cycle according to said amplification factor control signal in the next clock cycle.

2. The circuit for controlling multi-channel power of claim 1, wherein, said gain module comprises:
    a first amplifier, configured that a non-inverting input end connects to the output end of said single channel selection module; an inverting input end respectively connects to a first end of a divider resistor and a first end of at least one feedback resistor; an output end connects to the input end of said A/D conversion module; and
    a first one-out-of-multiple analog switch, configured that at least one first input end connects to a second end of said at least one feedback resistor respectively; a second input end connects to the second output end of said gain control module;
    wherein, a second end of said divider resistor connects to ground, and the number of the feedback resistors is the same as that of the first input ends of said first one-out-of-multiple analog switch.

3. The circuit for controlling multi-channel power of claim 1, wherein, said gain module comprises:
    a first amplifier, configured that a non-inverting input end connects to the output end of said single channel selection module; an inverting input end respectively connects to a first end of a divider resistor and a first end of at least one feedback resistor;
    a first one-out-of-multiple analog switch, configured that at least one first input end connects to a second end of said at least one feedback resistor respectively; a second input end connects to the second output end of said gain control module; and
    a second amplifier, configured that a non-inverting input end connects to an output end of said first amplifier; an inverting input end connects to an output end of the second amplifier;
    the output end connects to the input end of said A/D conversion module;
    wherein, a second end of said divider resistor connects to ground, and the number of the feedback resistors is the same as the number of the first input ends of said first one-out-of-multiple analog switch.

4. The circuit for controlling multi-channel power of claim 1, wherein, said gain module comprises:
    a first amplifier, configured that a non-inverting input end connects to the output end of said single channel selection module; an inverting input end respectively connects to a first end of a divider resistor and a first end of at least one feedback resistor;
    a first one-out-of-multiple analog switch, configured that at least one first input end connects to a second end of said at least one feedback resistor respectively; a second input end connects to the second output end of said gain control module; an output end connects to an output end of said first amplifier; and
    a second one-out-of-multiple analog switch, configured that at least one first input end connects with the second end of said at least one feedback resistor respectively; a second input end connects to the second output end of said gain control module; an output end connects to the input end of said A/D conversion module;
    wherein, a second end of said divider resistor connects to ground, and the number of the feedback resistors is the same as the number of the first input ends of said first one-out-of-multiple analog switch, and the number of the first input ends of said second one-out-of-multiple analog switch is the same as that of the first input ends of said first one-out-of-multiple analog switch.

5. The circuit for controlling multi-channel power of claim 1, wherein, said gain module comprises
    a first amplifier, configured that a non-inverting input end connects to the output end of said single channel selection module; an inverting input end respectively connects to a first end of a divider resistor and a first end of at least one feedback resistor;
    a first one-out-of-multiple analog switch, configured that at least one first input end connects to a second end of said at least one feedback resistor respectively; a second input end connects to the second output end of said gain control module; an output end connects to an output end of said first amplifier;

a second one-out-of-multiple analog switch, configured that at least one first input end connects with the second end of said at least one feedback resistor respectively; a second input end connects to the second output end of said gain control module; and a second amplifier, configured that a non-inverting input end connects to an output end of said second one-out-of-multiple analog switch; an inverting input end connects to an output end of said second amplifier, and the output end of said second amplifier connects to the input end of said A/D conversion module;

wherein, a second end of said divider resistor connects to ground, and the number of the feedback resistors is the same as that of the first input ends of said first one-out-of-multiple analog switch, and the number of the first input ends of the second one-out-of-multiple analog switch is the same as that of the first input ends of said first one-out-of-multiple analog switch.

6. The circuit for controlling multi-channel power of claim 4, wherein, an amplification factor of said amplification factor control signal in the next clock cycle is k=1+Rf/R0, where Rf is resistance of a resistor selected from said at least one feedback resistor according to the amplification factor control signal in the next clock cycle, and R0 is resistance of the divider resistor.

7. The circuit for controlling multi-channel power of claim 6, wherein, the amplification factor k is configured as a power of 2.

8. The circuit for controlling multi-channel power of claim 1, wherein, said single channel selection module is also configured to: connect the second input end to an output end of an optical multiplexing and demultiplexing module on an external optical add/drop unit board.

9. The circuit for controlling multi-channel power of claim 2, wherein, when the number of said at least one feedback resistor is greater than 1, resistance values of said at least one feedback resistor are different.

10. The circuit for controlling multi-channel power of claim 1, wherein, said channel selection signal is a signal selected by in turn cycling each channel signal of said received at least one channel signal.

11. A method for controlling multi-channel power, the method comprising:

selecting one channel signal in a previous clock cycle from received at least one channel signal in the previous clock cycle according to a channel selection signal in the previous clock cycle;

amplifying the selected one channel signal in the previous clock cycle according to an amplification factor control signal in the previous clock cycle to acquire a first signal;

perform A/D conversion on the first signal to acquire a second signal; and generating an amplification factor control signal in a next clock cycle according to said second signal, wherein when said second signal is less than a first threshold, the amplification factor in the next clock cycle is greater than a second threshold, and when said second signal is greater than or equal to the first threshold, the amplification factor in the next clock cycle is less than or equal to the second threshold, so as to amplify a selected one channel signal in the next clock cycle according to the amplification factor control signal in the next clock cycle when the next clock cycle comes, wherein, the selected one channel signal in the previous clock cycle and the selected one channel signal in the next clock cycle belong to the same channel.

12. The circuit for controlling multi-channel power of claim 5, wherein, an amplification factor of said amplification factor control signal in the next clock cycle is k=1+Rf/R0, where Rf is resistance of a resistor selected from said at least one feedback resistor according to the amplification factor control signal in the next clock cycle, and R0 is resistance of the divider resistor.

13. The circuit for controlling multi-channel power of claim 12, wherein, the amplification factor k is configured as a power of 2.

14. The circuit for controlling multi-channel power of claim 3, wherein, when the number of said at least one feedback resistor is greater than 1, resistance values of said at least one feedback resistor are different.

15. The circuit for controlling multi-channel power of claim 4, wherein, when the number of said at least one feedback resistor is greater than 1, resistance values of said at least one feedback resistor are different.

16. The circuit for controlling multi-channel power of claim 5, wherein, when the number of said at least one feedback resistor is greater than 1, resistance values of said at least one feedback resistor are different.

17. The circuit for controlling multi-channel power of claim 2, wherein, said channel selection signal is a signal selected by in turn cycling each channel signal of said received at least one channel signal.

18. The circuit for controlling multi-channel power of claim 3, wherein, said channel selection signal is a signal selected by in turn cycling each channel signal of said received at least one channel signal.

19. The circuit for controlling multi-channel power of claim 4, wherein, said channel selection signal is a signal selected by in turn cycling each channel signal of said received at least one channel signal.

20. The circuit for controlling multi-channel power of claim 5, wherein, said channel selection signal is a signal selected by in turn cycling each channel signal of said received at least one channel signal.

* * * * *